United States Patent [19]
Tchamov et al.

[11] Patent Number: 5,896,070
[45] Date of Patent: Apr. 20, 1999

[54] VOLTAGE OR CURRENT CONTROLLED EMITTER-COUPLED MULTIVIBRATOR WITH PULL-DOWN AMPLIFIERS

[76] Inventors: Nikolay Tchamov, Lindforsinkatu 21 A 17, FIN-33720 Tampere; Petri Jarske, Pirilänkuja 8, FIN-34240 Kämmenniemi, both of Finland

[21] Appl. No.: 08/853,933

[22] Filed: May 9, 1997

[30] Foreign Application Priority Data

May 9, 1996 [FI] Finland ................................. 961985

[51] Int. Cl.⁶ ................................................. H03K 3/282
[52] U.S. Cl. ................................. 331/113 R; 331/144
[58] Field of Search .............................. 331/113 R, 144

[56] References Cited

U.S. PATENT DOCUMENTS

| | | | |
|---|---|---|---|
| 3,665,343 | 5/1972 | Thompson | 331/113 R |
| 3,855,551 | 12/1974 | Ishigaki et al. | 331/113 R |
| 4,083,019 | 4/1978 | Hamada et al. | 331/113 R |

FOREIGN PATENT DOCUMENTS

1358 138  6/1974  United Kingdom.

*Primary Examiner*—Siegfried H. Grimm
*Attorney, Agent, or Firm*—Scully, Scott Murphy and Presser

[57] ABSTRACT

An emitter-coupled multivibrator oscillator circuit including a pair of main transistors (Q1,Q2) having a positive feedback, in which the base of each transistor is connected to the collector of the other transistor via buffer transistors (Q3,Q4). A capacitor (C) is connected between the emitters of the main transistors. The circuit further comprises pull-down transistors (Q5, Q6), cross-connected so that they are positively driven to alternate between a conducting and a non-conducting state according to the states of the main transistors. The frequency of the oscillator is adjusted by controlling the current (I1) passing through the capacitor (C). Additionally, a compensating current (Icom) is arranged to flow through the collector resistors (Rc1,Rc2) of the main transistors so that the total current passing through each resistor is essentially constant and independent of the control current (I1). This way the signal amplitude of the oscillator is not affected by the frequency control.

6 Claims, 2 Drawing Sheets

VOLTAGE OR CURRENT CONTROLLED EMITTER-COUPLED MULTIVIBRATOR WITH PULL-DOWN AMPLIFIERS

FIELD OF THE INVENTION

The invention relates generally to oscillator circuits, and specifically to controlled oscillators based on emitter coupled multivibrators.

BACKGROUND OF THE INVENTION

Current and voltage controlled oscillators (ICO and VCO) are important components in the structures of transmitters and receivers. When applications in portable wireless communications systems are concerned, the main requirements for VCO/ICO:s are: an operational frequency range of 1 to 20 GHz, very low phase noise, and the lowest possible operating voltage and power consumption. Depending on the structure, a communications device may comprise several VCO/ICO:s needed for different purposes, e.g. frequency conversion, synthesis, modulation etc. Their performance will significantly affect the performance of the entire communications unit. However, the demand to implement these oscillators for silicon technologies faces several problems.

During the last few years several research projects have focused on finding optimal solutions. Two main types of oscillators are used as the cores of VCO/ICO:s: sinusoidal oscillators and relaxational oscillators. Sinusoidal oscillators usually produce the best parameters as far as high frequency and low phase noise are concerned, but they can be easily implemented mostly on GaAS technologies only. The transition to Bipolar, CMOS, or BiCMOS technologies causes several problems mainly due to the highly conductive wafer substrate. However, the speed of such available technologies is a challenge to researchers, as at present transient frequencies of 10 to 40 GHz are reached, a transient range that was previously considered to be able to be covered by materials based on GaAS only. The speed of silicon-based technologies is at present sufficient for mobile communication in the frequency range of 1 to 20 GHz, used by most mobile stations and wireless LANs. An additional driving factor in the design of portable equipment has always been a high demand for as low an operating voltage supply as possible and very low power consumption.

In LC type of oscillators the active circuit components are kept out of the non-linear operation range, whereas in relaxational oscillators the sinusoidal signal is the result of the incapability of the pulse circuit to switch fast enough at very high frequencies.

Several different circuit structures can be used to implement oscillation circuits, that is oscillators. One of these is an astable (freely running) multivibrator. FIG. 1 shows a conventional emitter-coupled multivibrator circuit used for implementing voltage controlled oscillators (VCO). The circuit comprises a pair of transistors Q1 and Q2 between which there is provided a positive feedback by the collector of each transistor being connected via a buffer transistor Q3, Q4 to control the base of the other transistor. The collectors of Q1 and Q2 are connected via resistors Rc1 and Rc2, respectively, to a potential in a supply voltage source 1, and the emitters are connected via current sources 3 and 4, respectively, to a lower potential in the supply voltage source. Similarly, the emitters of the buffer transistors Q3 and Q4 are connected via current sources 5 and 6 to a lower potential. Additionally, a capacitance C is connected between the emitters of transistors Q1 and Q2. The positive feedback, and series-resonant circuits Rc1-C and Rc2-C provided by the resistors Rc1 and Rc2 and the capacitance C make the multivibrator output oscillate continuously between two states once oscillation has been triggered. The values of the RC series-resonant circuit components determine the oscillation frequency.

The operation of a multivibrator will be studied in greater detail in the following. Let us assume that initially Q1 and Q3 are off (in a non-conducting state). When Q1 is off, the collector of Q1 and the base of Q2 are approximately at the supply voltage potential, and Q2 is on (in a conducting state) and the emitter current of Q2 is I1+I2. The buffer transistor Q4 is also on and supplies a base current to Q2. When Q2 is conductive, the current I1 passes from the emitter of Q2 via the capacitance C to the emitter of Q1. At this time the current I1 recharges/discharges the charge of the capacitance C, the emitter potential of Q1 falling at a certain rate until Q1 becomes conductive as the base emitter voltage of Q1 exceeds approx. 0.6V. As Q1 becomes conductive, its collector voltage starts to drop and hence the buffer transistor Q3 starts to turn off. Due to the positive feedback provided via Q4, the base voltage of Q2 also drops and Q2 turns off. As Q2 turns off, the collector voltage of Q2 increases, speeding up the switching on of Q3. As Q3 switches on, the base current of Q1 increases via the positive feedback. The higher base current discharges faster the spurious capacitances of the base circuit of Q1 and thereby speeds up the switching on of Q1. When Q2 is off and Q1 is on, the current I2 passes from the emitter of Q1 via the capacitance C to the emitter of Q2, where the emitter voltage starts to drop until it again causes Q2 to turn on and, via Q3, Q1 to turn off.

The speed (maximum resonance frequency) of such a multivibrator circuit depends primarily on the properties of the transistors Q1 and Q2. The buffer transistors Q3 and Q4 raise the speed of the multivibrator as they provide a higher base current which again discharges the spurious capacitances of the base circuits of the transistors Q1 and Q2 more rapidly and thus speeds up the switching of a transistor from one state to another.

The lowest possible supply voltage Vcc is achieved when it is assumed that the current sources 3 and 4 are ideal, i.e. no voltage drop is generated in them. Replacing ideal current sources by a practical circuit structure, such as current mirror, increases Vcc. Reverting to the operating principle of a circuit, it may be stated that either Q1-C-current mirror 4 or Q2-C-current mirror 3 constitute the current paths and that the current mirrors generate a stable current through the reference capacitor C, this being the main reason for the typically low phase noise. When looking for a new way to increase speed, the capacitance of the reference capacitor cannot be reduced much more as it would be about the same as that of the spurious capacitances, and thus controlled design of the circuit would no longer be possible.

However, nowadays higher and higher speeds are needed and at the same time the objective is to render the supply voltage as low as possible, especially in electronic devices using battery power supplies.

To realize a current or voltage controlled oscillator by means of a multivibrator circuit requires the addition of a suitable control solution to the circuit. Such a control should be as simple as possible.

In the circuit of FIG. 1 the pulse amplitude is determined by the sum of the currents I1+I2 multiplied by the value of the collector resistor Rc1 or Rc2 of the corresponding cycle. Pulse width is determined by the value of the current fed by either I1 or I2 via the reference capacitor C during its recharge cycles. Hence the capacitance of the reference capacitor C or the current passing through it have to be changed for frequency control.

The capacitance can be changed if a varactor is used as the reference capacitor C. The problem is, however, that varactor technologies are usually not compatible with e.g. BiCMOS technologies. Instead, a PN junction can be used in the BiCMOS technology. In this case, however, in the circuit of FIG. 1 the capacitor is operating continuously and changes the polarity of the voltage. In this case series coupling of two varactors, oppositely relative each other, may be a kind of a solution, but owing to the operation of the forward voltage range of one of the diodes, nonlinearities will occur, and the phase noise of the multivibrator could be unacceptably high.

Another alternative is to change the current and as a result the speed of the capacitor recharge. This is a very efficient way of controlling the frequencies of the oscillations but its main disadvantage is its direct impact on pulse amplitudes.

SUMMARY OF THE INVENTION

It is an object of the present invention to provide a new voltage or current controlled oscillator circuit with higher speeds as compared with prior art circuits.

It is another object of the present invention to provide a new voltage or current controlled oscillator circuit with simple and wide frequency control.

The invention relates to an oscillator circuit comprising an operating voltage supply, a first non-linear amplifier component comprising a first and a second main electrode and a control electrode, a second non-linear amplifier component comprising a first and a second main electrode and a control electrode, a third amplifier component whose main electrodes are connected to the control electrode of the first amplifier component and to the first potential of the operating voltage supply, and whose control electrode is operationally connected to the first main electrode of the second amplifier component in order to provide a positive feedback, a fourth amplifier component whose main electrodes are connected to the control electrode of the second amplifier component and to the first potential of the operating voltage supply, and whose control electrode is operationally connected to the first main electrode of the first amplifier component in order to provide a positive feedback, a capacitive component connected between the second main electrode of the first amplifier component and the second main electrode of the second amplifier component, a first and a second resistor via which the first main electrode of the first amplifier component, and the first main electrode of the second amplifier component, respectively, are connected to the first potential of the operating voltage supply. The oscillator is characterized in that it comprises, a fifth amplifier component whose first main electrode is connected to the second main electrode of the first amplifier component, the second main electrode of the fourth amplifier component being operationally connected to control the fifth amplifier component in order to provide a positive feedback, a sixth amplifier component whose first main electrode is connected to the second main electrode of the second amplifier component, the second main electrode of the third amplifier component being operationally connected to control the sixth amplifier component in order to provide a positive feedback, a first adjustable current source whose first terminal is connected to the second main electrodes of the fifth and the sixth amplifier components and whose second terminal is connected to the second potential of the operating voltage supply, the frequency of said oscillator being adjustable by controlling the current I1 of the first current source, means for providing a compensating current to flow via the first resistor and similarly via the second resistor, so that the current passing through each resistor is essentially constant and independent of the current I1.

The relaxational oscillator of the invention is based on a new multivibrator structure. The multivibrator is provided with a fifth and a sixth amplifier component operating as active pull-down components. The pull-down amplifier components are operationally cross-connected via a third and a fourth buffer transistor so that they are forced to alternate between a conducting and a non-conducting state according to the state of the first and the second amplifier component. When the second amplifier component is in a non-conducting state and the first amplifier component is in a conducting state, a fifth pull-down amplifier component, connected between the second main electrode of the first amplifier component and the second operating voltage potential, is in a non-conducting state. A sixth pull-down amplifier component connected between the second main electrode of the second amplifier component and the second operating voltage potential is in a conducting state and pulls down the second main electrode into the second operating voltage potential. In this case only one current path passes via the first amplifier component, the capacitive component and the sixth amplifier component. Similarly, when the first amplifier component is in a non-conducting state and the second amplifier component is in a conducting state, the sixth pull-down amplifier component is in a non-conducting state and the fifth pull-down amplifier component is in a conducting state. In this case only one current path passes via the second amplifier component, the capacitive component and the fifth pull-down amplifier component. By means of pull-down technique, a two times higher output signal amplitude is achieved in this "double cross-connected" multivibrator circuit with the same operating voltage as compared with prior art multivibrator circuits.

In the oscillator of the invention a control current is led via actively pulled down amplifier components and a first current source. A change in the control current causes a change in the oscillator output frequency. In order to make the amplitude of the oscillator output signal independent of the control current, an extra compensating current is led via resistors connected between the first and the second amplifier components and the first potential of the current source. The compensating current is preferably controlled similarly but in a different direction than the control current so that the current via the resistors is constant. This compensating current is provided by a seventh and an eighth amplifier component, connected from the second main electrode of the first and the second amplifier component via the second current source into earth. The seventh and the eighth amplifier components are connected to be positively driven to follow the states of the fifth and the sixth amplifier components.

The third and the fourth buffer amplifier means preferably also have corresponding pull-down amplifier components, cross-connected to be positively driven to follow the states of the fifth and the sixth pull-down transistor. This significantly increases speed and the efficiency of the emitter followers formed by the third and the fourth amplifier components, and provides a higher amplitude and a lower output resistance from the same low-voltage power source as compared with prior art solutions.

BRIEF DESCRIPTION OF THE DRAWINGS

The invention will be described in the following with reference to the attached drawings, where.

DETAILED DESCRIPTION OF THE INVENTION

The present invention is applicable to lowering operating voltage, increasing speed and implementing frequency control in oscillators based on what are known as emitter-coupled multivibrator circuits. Although the oscillator shown in FIG. 2 comprises bipolar transistors as amplifier devices, in practice the circuit solution of the invention can employ any type of non-linear amplifier components, such as MOS, CMOS, SOI, HEMT and HBT transistors, microwave tubes and vacuum tubes. The names of the electrodes in these components may vary. The main electrodes of a bipolar transistor are a collector and an emitter, a control electrode constituting the base. In FET transistors the corresponding electrodes are a drain, a source, and a gate. In vacuum tubes corresponding electrodes are usually called an anode, a cathode and a grid. This means that the term emitter-coupled multivibrator as used here has a more general meaning, covering e.g. the terms cathode-coupled or source-coupled multivibrator.

Figure 2:
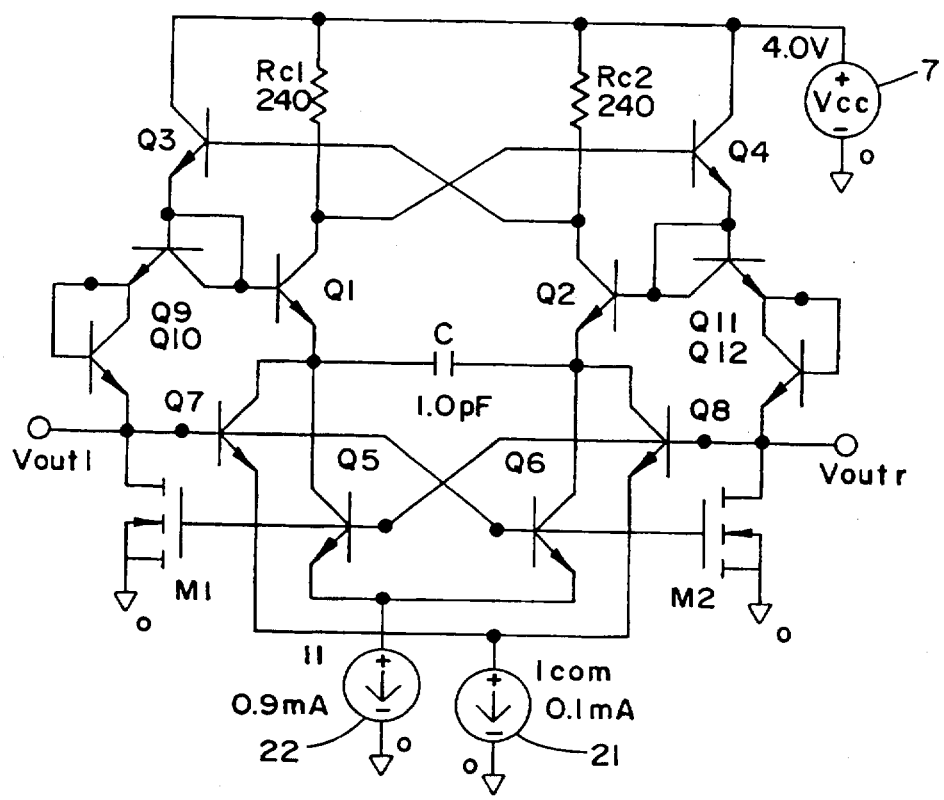
FIG. 2 is a circuit diagram of an oscillator of the invention.

FIG. 2 shows an oscillator according to the preferred embodiment of the invention and based on an emitter-coupled multivibrator circuit. Let us first study the structure of the actual multivibrator circuit.

A multivibrator circuit comprises six NPN bipolar transistors Q1, Q2, Q3, Q4, Q5 and Q6. The collector electrode of the transistor Q1 is connected via a resistor Rc1 to the operating voltage Vcc, and the emitter is connected to the collector of the transistor Q5. The collector of the transistor Q2 is connected via a resistor Rc2 to the operating voltage Vcc and the emitter to the collector of the transistor Q6. The emitters of the transistors Q5 and Q6 are connected together and via a current source 22 to an operating voltage potential 0V. A capacitor C is connected between the emitters of transistors Q1 and Q2.

A positive feedback is provided between the transistors Q1 and Q2 so that the collector of Q2 is connected via the buffer transistor Q3 to the base of Q1, and the collector of Q1 via the buffer transistor Q4 to the base of Q2. Similarly, a positive feedback is provided between the transistors Q5 and Q6 so that the signals from the bases of the transistors Q1 and Q2 are connected via the buffer transistors Q3 and Q4, respectively to the bases of the pull-down transistors Q6 and Q5, respectively.

To be more exact, the base of Q3 is connected to the collector of Q2 and the collector of Q3 is connected to the operating voltage Vcc. The emitter of Q3 is connected to the base and the collector of a diode-coupled transistor Q9, and to the base of the transistor Q1. The emitter of the transistor Q9 is connected to the collector and base of a second diode-coupled transistor Q10. The emitter of the transistor Q10 is connected to the base of the transistor Q6.

Similarly the base of Q4 is connected to the collector of Q1 and the collector of Q4 is connected to the operating voltage Vcc. The emitter of Q4 is connected to the base and collector of a diode-coupled transistor Q11, and to the base of the transistor Q2. The emitter of the transistor Q11 is connected to the collector and base of a second diode-coupled transistor Q12. The emitter of the transistor Q12 is connected to the base of the transistor Q8. The base of Q3 is connected to the collector of Q2, and the base of Q4 to the collector of Q1.

The buffer transistors Q3 and Q4 enable the base currents of the transistors Q1, Q2, Q5 and Q6 to be increased, leading to more rapid discharge of the spurious capacitances of the base electrodes and, consequently, a higher transistor switching speed.

Additionally, a pull-down transistor M1, a MOS transistor, is connected in series between the emitter of Q10 and the operating voltage 0V. In the same way a pull-down transistor M2, a MOS transistor, is connected between the emitter of Q12 and the operating voltage 0V. M1 and M2 are cross-connected to be positively driven to follow the states of the pull-down transistors Q5 and Q6, respectively. More exactly, the gate of M1 is connected to the base of Q5 and the gate of M2 is connected to the base of Q6.

Positive feedback and the series-resonant circuits Rc1-C and Rc2-C formed by the resistors Rc1, Rc2 and the capacitor C make the multivibrator output (e.g. the emitters of Q10 and Q12) oscillate between two states once oscillation has been triggered. The resonance frequency of the circuit is set by the values of the components Rc1, Rc2, and C.

Figure 1:
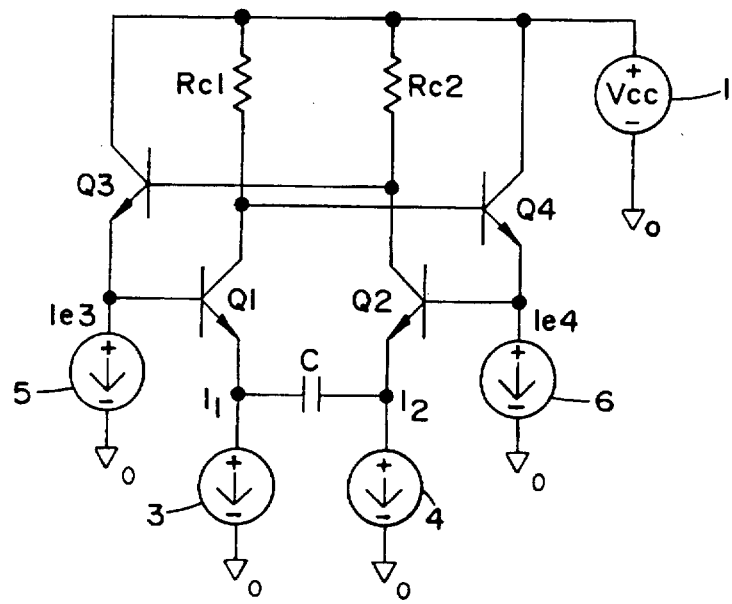
FIG. 1 is a circuit diagram of a prior art multivibrator.

In a multivibrator circuit of the invention, the pull-down transistors Q5 and Q6 replace the current sources of conventional multivibrator circuits, shown in FIG. 1. Owing to the cross-connection of the transistors Q5 and Q6 they are positively driven to alternate between on or off states according to the states of the transistors Q1 and Q2. Let us assume, for example, that the transistor Q1 is on and the transistor Q2 is off. In this case the emitter of the transistor Q10 inputs a base current to the base of the transistor Q6 making it conductive. In a conducting state the transistor Q6 pulls down the emitter voltage of Q2 to the potential 0V almost without voltage drop, if the current source 22 is considered ideal. As a result, the transistor Q5, whose base is connected to the emitter of Q12, is off, and no current passes through Q5. Now the multivibrator circuit only has one current path, that is Rc1-Q1-C-Q6. The transistor Q5, which is not conductive, fully separates one terminal of the capacitor C from the potential 0V. The transistor Q6, which is on, connects the other terminal of the capacitor C to the potential 0V almost without voltage drop, if the current source 22 is considered ideal. Similarly, in another oscillation state, Q1 is off, Q2 is on, Q5 is on and Q6 is off. In this case the multivibrator circuit only has one current path, that is Rc2-Q2-C-Q5. Q6, which is off, fully separates one terminal of the capacitor C from the potential 0V. The transistor Q5, which is on, pulls down the other terminal of the capacitor C to the potential 0V almost without voltage drop, if the current source 22 is considered ideal. This way as high a portion as possible of the operating voltage is provided across the capacitor.

Consequently, as the cross-connected pull-down transistors Q5 and Q6 make it possible to eliminate voltage drop caused by current sources in conventional multivibrator circuits, a multivibrator circuit implemented by the double cross-connected pull-down technique of the invention generates a two times higher output signal amplitude at the same operating voltage as compared with the conventional circuit of FIG. 1. Additionally, pull-down transistors provide a significantly high circuit speed compared with prior art solutions.

In practice the current source 22, however, consists of e.g. a voltage-controlled current mirror. In this case a voltage drop is present across the current mirror and hence a slightly higher operating voltage is required.

By control of the current I1 passing through the current source 22 (the current passing through the capacitor C) the frequency of the oscillator can be controlled. If the current source 22 is composed of a voltage-controlled current mirror, a voltage-controlled oscillator VCO is provided. If the current source 22 is implemented by a current-controlled circuit solution, a current-controlled oscillator is provided. These different implementations of a current source 22 are obvious to those skilled in the art.

The oscillator oscillates between two states. In the first state the control current I1 passes via the path Rc1-Q1-C-Q6 to the current source 22. In the second state the control current I1 flows via the path Rc2-Q2-C-Q5 to the current source 22. Hence the control current also passes via the collector resistors Rc1 and Rc2 and affects the amplitude of the oscillator output signal. That is, the signal amplitude changes as the control current I1 and the frequency are changed.

In an embodiment of the invention the amplitude of the oscillator output signal is made independent of the control current I1 so that an extra compensating current Icom is led through the resistors Rc1 and Rc2. The compensating current Icom is preferably controlled in the same way as but into a different direction than the control current I1 so that the total current via the resistors Rc1 and Rc2 is constant. For this purpose the oscillator circuit comprises the transistors Q7 and Q8, connected from the emitters of Q1 and Q2, respectively, via a second current source 21 to the operating voltage potential 0V. Q7 and Q8 are connected to be positively driven to follow the states of Q6 and Q5, respectively. More exactly, the collector of Q7 is connected to the emitter of Q1, the base is connected to the base of Q6, and the emitter is connected to the first terminal of the current source 21. Similarly, the collector of Q8 is connected to the emitter of Q2, the base is connected to the base of Q5, and the emitter is connected to the first terminal of the current source 21. The second terminal of the current source is connected to the operating voltage potential 0V.

The purpose of the diode-coupled transistors Q9 to Q12 is to eliminate the saturation of the transistors Q7 and Q8.

In the first oscillations state of the oscillator the control current I1 passes via the path Rc1-Q1-C-Q6 to the current source 22. Q7 and Q6 are both on at the same time, and thus the compensating current Icom passes by the path Rc1-Q1-Q7 to the current source 21. This way a constant current I1+Icom passes through the resistor Rc1 irrespective of the value of I1. The situation is similar for the current passing through the resistor Rc2 in the second oscillation state.

The circuit of FIG. 2 has been analyzed by the 0.8 μm BiCMOS technology, in which bipolar NPN transistors have a transient frequency $F_{TMAX}=14$ GHz. The current passing through the transistors is selected so that it provides the transient frequency of $F_T$, the current being about 800 μA using this technology. The MOS transistors M1 and M2 have a W=1.2 μm and a W/L=100. The maximum oscillation frequency, about 2 GHz, is achieved by the minimum value 0.2 pF of the capacitor C. Amplitude is about 0.4V and power consumption about 16 mW from an operating voltage of 4.5V. The control capability of the circuit is 1250 MHz/ mA. Phase noise is low. The oscillator is also capable of operating at low frequencies, at which is it easier to employ larger external capacitors C. For its operation the circuit needs at least 4.4V (4.0+0.4V), of which about 0.4 V is supposed to be the voltage across the actual current sources when MOS transistors are used to generate I1 and Icom.

Figure 3:
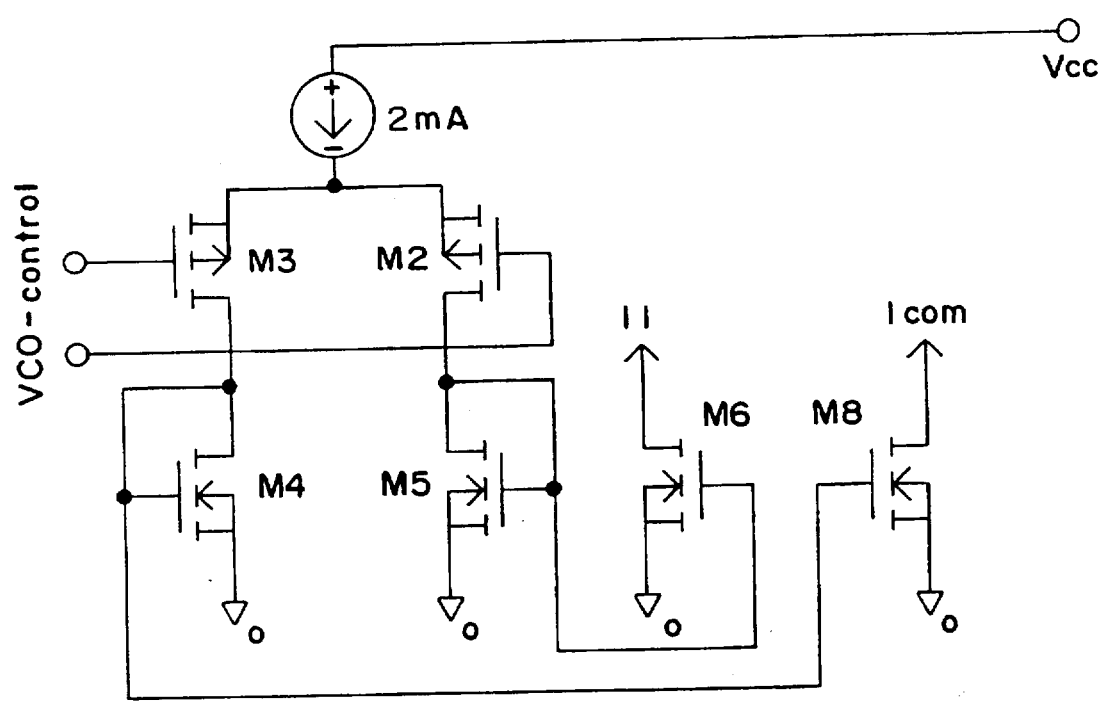
FIG. 3 is a circuit diagram of a controlled current source.

FIG. 3 shows one way of implementing a controlled current source in the circuit of FIG. 2. In FIG. 3 the currents I1 and Icom are provided by current mirrors M6 and M8 controlled by a differential amplifier M2-M3-M4-M5. The differential amplifier is controlled by a control voltage VCOcontrol.

The invention may be implemented solely by the Bipolar technique.

The oscillator circuit of the invention is especially suited for modern phase locked loops (PLL) in communications and microprocessor applications.

The drawings and the related description have been presented for purposes of illustration only. The details of the invention may be modified within the scope and spirit of the appended claims.

We claim:

1. An oscillator circuit comprising an operating voltage supply (1), a first non-linear amplifier component (Q1) comprising a first and a second main electrode and a control electrode, a second non-linear amplifier component (Q2) comprising a first and a second main electrode and a control electrode, a third amplifier component (Q3) comprising a first and a second main electrode and a control electrode, and whose main electrodes are connected to the control electrode of the first amplifier component (Q1) and to the first potential of the operating voltage supply (1), and whose control electrode is operationally connected to the first main electrode of the second amplifier component (Q2) in order to provide a positive feedback, a fourth amplifier component (Q4) comprising a first and a second main electrode and a control electrode, and whose main electrodes are connected to the control electrode of the second amplifier component (Q2) and to the first potential of the operating voltage supply (1), and whose control electrode is operationally connected to the first main electrode of the first amplifier component (Q1) in order to provide a positive feedback, a capacitive component (C) connected between the second main electrode of the first amplifier component (Q1) and the second main electrode of the second amplifier component (Q2), a first and a second resistor (Rc1, Rc2) via which the first main electrode of the first amplifier component (Q1), and similarly the first main electrode of the second amplifier component (Q2) is connected to the first potential of the operating voltage supply (1), a fifth amplifier component (Q5) comprising a first and a second main electrode and a control electrode, and whose first main electrode is connected to the second main electrode of the first amplifier component (Q1), the second main electrode of the fourth amplifier component (Q4) being operationally connected to control the fifth amplifier component in order to provide a positive feedback, a sixth amplifier component (Q6) comprising a first and a second main electrode and a control electrode, and whose first main electrode is connected to the second main electrode of the second amplifier component (Q2), the second main electrode of the third amplifier component (Q3) being operationally connected to control the sixth amplifier component in order to provide a positive feedback, a first controlled current source (22) whose first terminal is connected to the second main electrodes of the fifth and the sixth amplifier components (Q5, Q6) and whose second terminal is connected to the second potential of the operating voltage supply (1), the frequency of said oscillator being controlled by means of the current I1 of the first current source, means (Q7, Q8, 21) for providing a compensating current to flow via the first resistor (Rc1) and similarly via the second resistor (Rc2), so that the total current passing through each resistor is essentially constant and independent of the current I1.

2. An oscillator as claimed in claim 1, wherein said means comprise a seventh amplifier component (Q7) comprising a first and a second main electrode and a control electrode, and whose first main electrode is connected to the second main electrode of the first amplifier component (Q1) and whose control electrode is operationally connected to the second main electrode of the third amplifier component (Q3), an eighth amplifier component (Q8) comprising a first and a second main electrode, and a control electrode, and whose first main electrode is connected to the second main electrode of the second amplifier component (Q2) and whose control electrode is operationally connected to the second main electrode of the fourth amplifier component (Q4), a second controlled current source whose first terminal is connected to the second main electrodes of the seventh and the eighth amplifier components (Q7, Q8) and whose second terminal is connected to the second potential of the operating voltage supply (1).

3. An oscillator as claimed in claim 2, wherein the second current source is controllable so that the sum of the compensating current of the second current source and the control current of the first current source is essentially constant.

4. An oscillator as claimed in claims 2 or 3, comprising a diode-coupled ninth amplifier component (Q9) comprising a first and a second main electrode, and a control electrode, and whose first main electrode and control electrode are connected to the control electrode of the first amplifier component (Q1) and to the second main electrode of the third amplifier component (Q3), a diode-coupled tenth amplifier component (Q10) whose first main electrode and control electrode are connected to the second main electrode of the ninth amplifier component (Q9), and whose second main electrode is connected to the control electrodes of the sixth (Q6) and the seventh (Q7) amplifier components, a diode-coupled eleventh amplifier component (Q11) whose first main electrode and control electrode are connected to the control electrode of the second amplifier component (Q2) and to the second main electrode of the fourth amplifier component (Q4), a diode-coupled twelfth amplifier component (Q12) whose first main electrode and control electrode are connected to the second main electrode of the eleventh amplifier component (Q11), and whose second main electrode is connected to the control electrodes of the fifth (Q5) and the eighth (Q8) amplifier components.

5. An oscillator as claimed in claim 4, comprising a thirteenth amplifier component (M1), connected between the second main electrode of the tenth amplifier component (Q10) and the second potential of the operating voltage supply (1), and whose control electrode is connected to the control electrode of the fifth amplifier component (Q5), a fourteenth amplifier component (M2), connected between the second main electrode of the twelfth amplifier component (Q12) and the second potential of the current source (1), and whose control electrode is connected to the control electrode of the sixth amplifier component (Q6).

6. An oscillator as claimed in claim 5, wherein the first, second, third, fourth, fifth, sixth, seventh, eighth, ninth, tenth, eleventh, and twelfth amplifier components are bipolar transistors, and that the thirteenth and fourteenth amplifier components are MOS transistors.

* * * * *